United States Patent
Makimoto et al.

(10) Patent No.: US 6,667,498 B2
(45) Date of Patent: Dec. 23, 2003

(54) NITRIDE SEMICONDUCTOR STACK AND ITS SEMICONDUCTOR DEVICE

(75) Inventors: Toshiki Makimoto, Kanagawa (JP); Kazuhide Kumakura, Kanagawa (JP); Naoki Kobayashi, Kanagawa (JP)

(73) Assignee: Nippon Telegraph and Telephone Corporation (JP)

( * ) Notice: Subject to any disclaimer, the term of this patent is extended or adjusted under 35 U.S.C. 154(b) by 0 days.

(21) Appl. No.: 10/163,698

(22) Filed: Jun. 5, 2002

(65) Prior Publication Data

US 2002/0195619 A1 Dec. 26, 2002

(30) Foreign Application Priority Data

Jun. 7, 2001 (JP) ........................................ 2001-172969

(51) Int. Cl.$^7$ .......................................... H01L 31/0328
(52) U.S. Cl. ........................ 257/183; 438/312; 257/197
(58) Field of Search .......................... 257/76, 183, 192, 257/194, 195, 196, 197, 200, 198, 94, 96, 97; 438/312

(56) References Cited

U.S. PATENT DOCUMENTS

| | | | |
|---|---|---|---|
| 5,831,277 A | * 11/1998 | Razeghi | 257/15 |
| 6,605,486 B2 | * 8/2003 | Fujimoto | 438/48 |
| 2002/0149033 A1 | * 10/2002 | Wojtowicz | 257/198 |

FOREIGN PATENT DOCUMENTS

| JP | 10-282487 | 10/1998 |
|---|---|---|
| JP | 2000-299532 | 10/2000 |

OTHER PUBLICATIONS

H. Ito, et al., "GaAs/In$_{0.08}$Ga$_{0.92}$As Double Heterojunction Bipolar Transistors With A Lattice–Mismatched Base", *Japanese Journal of Applied Physics*, vol. 25, No. 5, May 1986, pp. L421–L424.

N.Y. Li, et al., "DC Characteristics of MOVPE–Grown Npn InGaP/InGaAsN DHBTs", *Electronics Letters*, vol. 36, No. 1, Jan. 6, 2000, 2 pages.

M. Konagai, et al., "(GaAl)As–GaAs Heterojunction Transistors With High Injection Efficiency", *Journal of Applied Physics*, vol. 46, No. 5, May 1975, pp. 2120–2124.

O. Ambacher, et al., "Two–Dimensional Electron Gases Induced by Spontaneous and Piezoelectric Polarization Charges in N– and Ga–Face AlGaN/GaN Heterostructures", *Journal of Applied Physics*, vol. 85, No. 6, Mar. 15, 1999, pp. 3222–3233.

O. Ambacher, et al., "Two Dimensional Electron Gases Induced by Spontaneous and Piezoelectric Polarization in Undoped and Doped AlGaN/GaN Heterostructures", *Journal of Applied Physics*, vol. 87, No. 1, Jan. 1, 2000, pp. 334–344.

T. Nittono, et al., "Extremely Low Resistance Non–Alloyed Ohmic Contacts to n–GaAs Using Compositionally Graded In$_x$Ga$_{1-x}$As Layers", *Japanese Journal of Applied Physics*, vol. 25, No. 10, Oct. 1986, pp. L865–L867.

S–Y. Chiu, et al., "Base Transit Time In Abrupt GaN/InGaN/GaN and AlGaN/GaN/AlGaN HBTs", *MRS Internet J. Nitride Semicond. Res. 4S1, G6.7 (1999)*, 6 pages.

* cited by examiner

*Primary Examiner*—Tuan H. Nguyen
(74) *Attorney, Agent, or Firm*—Ostrolenk, Faber, Gerb & Soffen, LLP

(57) ABSTRACT

A transistor structure is implemented which can achieve high current gain by causing electrons injected from an emitter to reach a collector. An InGaN graded layer, which is interposed between a p-type InGaN layer and an n-type GaN layer, includes an In composition that varies from 0% to 10%. A bandgap of the thin film structure is gradually reduced from the substrate side to the surface side. An AlN buffer layer is grown on an SiC substrate by 100 nm thick, followed by growing a Si-doped GaN layer used for forming an ohmic electrode. A Si-doped GaN layer (n-type GaN layer) is grown thereon, followed by growing an InGaN layer whose In composition is varied, and by growing, an Mg-doped InGaN (p-type GaN layer), thereby fabricating a heterojunction diode.

6 Claims, 16 Drawing Sheets

NITRIDE SEMICONDUCTOR STACK AND ITS SEMICONDUCTOR DEVICE

This application is based on patent application No. 2001-172969 filed on Jun. 7, 2001 in Japan, the content of which is incorporated hereinto by reference.

BACKGROUND OF THE INVENTION

1. Field of the Invention

The present invention relates to a nitride semiconductor stack and its semiconductor device, and more particularly to a semiconductor device such as a double heterojunction bipolar transistor and light emitting device using a nitride semiconductor stack.

2. Description of the Related Art

There arises band discontinuity at heterointerfaces between GaAs and AlGaAs, GaAs and InGaAs, and InGaAs and InP, which have been researched intensively.

FIG. 1 is a band diagram of a heterojunction of n-type InGaAs and n-type GaAs. In FIG. 1, the reference numeral 11 designates n-type InGaAs (including 10% In composition), and 12 designates n-type GaAs. Because of the band discontinuity in the heterostructure formed between the two semiconductors with small and large bandgaps, electrons cannot travel smoothly from the InGaAs with a smaller bandgap to the GaAs with a larger bandgap.

This is because the electrons are repelled by the discontinuity of the conduction band at the heterointerface 13 between the n-type InGaAs 11 and n-type GaAs 12. To eliminate the adverse effect of the band discontinuity, a graded layer is inserted between the two semiconductors so as to vary the bandgap gradually.

FIG. 2 is a band diagram of a structure including a graded layer between the n-type InGaAs with 10% In composition and the n-type GaAs. In FIG. 2, the reference numeral 21 designates the n-type InGaAs (including 10% In composition), 22 designates the n-type GaAs, and 23 designates the InGaAs graded layer. The In composition of the InGaAs in the graded layer 23 is varied from 10% to 0%, in which the InGaAs with 0% In composition corresponds to the GaAs. In this case, the electrons can move towards wider bandgap n-type GaAs smoothly without feeling the bandgap discontinuity. As for the double heterojunction bipolar transistor (DHBT) composed of the npn-type InGaAs and GaAs, the graded layer 23 is generally inserted between its base and collector (see, H. Ito and T. Ishibashi, Jpn. J. Appl. Phys. 25 (1986) L421).

In this case, the graded layer 23 is composed of InGaAs, in which the In composition varies gradually from 8% to 0% in a range of 30 nm. Although the graded layer is doped with n-type impurities of about $2 \times 10^{17}$ cm$^{-3}$, heavy doping of more than $1 \times 10^{18}$ cm$^{-3}$ is not performed. This is because the heavy doping presents a problem of reducing the breakdown voltage between the base and collector.

Examples of InGaAs/GaAs or InGaAsN/GaAs DHBTs reported up to now all disclose the graded layer of 30 nm thick, and the n-type impurity concentrations of $1 \times 10^{17}$ (cm$^{-3}$) and $3 \times 10^{16}$ (cm$^{-3}$) (H. Ito and T. Ishibashi, Jpn. J. Appl. Phys. 25 (1986) L421, and N. Y. Li et al. Electron. Lett. 36 (2000)). A thinner graded layer will present the following problems: (1) The composition control becomes difficult; (2) The electrons do not feel the graded layer because the spread of the wave function of electrons is about an order of 10 nm. On the other hand, the collectors range from 200 to 500 nm thick in almost all examples fabricated. When the thickness of the graded layer is not negligible compared with the thickness of the collector, there arises another problem of long collector transit time, which increases its response time and deteriorates the high frequency characteristics. For these reasons, the conventional reports are supposed to use rather thin graded layers of 30 nm thick.

In the nitride semiconductor heterojunction, space charges are brought about in the heterointerface because of piezoelectric effect or spontaneous polarization. The amount of the space charges is approximately proportional to a lattice constant difference between the two layers constituting the heterojunction. In other words, an increasing lattice constant difference between the two layers will increase the piezoelectric charges. Generally, an increasing lattice constant difference between the two layers will also increase the energy difference of the bandgap.

FIG. 3 is a diagram showing a heterojunction of InGaN and GaN. In FIG. 3, the reference numeral 31 designates InGaN, 32 designates GaN, 33 designates a heterointerface and 34 designates space charges in the heterointerface. Since the InGaN 31 is present on the surface side, negative space charges 34 occur in the heterointerface 33 and the band is modulated by the space charges 34. In contrast with this, when the GaN 32 is present on the surface side, positive space charges are produced in the heterointerface 33.

It is expected that the space charges will be generated in the nitride semiconductor graded layer which is formed with varying the composition of the constituent elements. Currently, no idea is proposed that when the graded layer is formed using the nitride semiconductor, the space charges are generated uniformly in the graded layer. However, as will be described in the examples in accordance with the present invention, it was found that the space charges were generated in the graded layer.

As for the DHBTs, a graded structure is interposed between the base and collector with varying the bandgap gradually. Because of the space charges generated in the graded layer using the nitride semiconductor, the electrons injected from the emitter cannot reach the collector through the base. Thus, the collector current cannot be increased, and the current gain cannot be increased.

In addition, there arises another problem in that it is difficult for the light emitting devices to inject electrons or holes into the active layer because of the space charges in the graded layer.

SUMMARY OF THE INVENTION

The present invention is implemented to solve the foregoing problems. Therefore, an object of the present invention is to provide a nitride semiconductor stack and its semiconductor device with a transistor structure capable of achieving high current gain by enabling the electrons injected from the emitter to reach the collector by solving the problem of being unable to increase the collector current in the DHBTs because of the space charges in the graded layer, which are generated by the piezoelectric effect or spontaneous polarization.

Another object of the present invention is to provide a nitride semiconductor stack and its semiconductor device capable of implementing a light emitting device structure that can reduce the voltage needed for the light emission and increase the luminous efficiency by efficiently injecting electrons or holes into the active layer by solving the problem in that it is difficult to inject the electrons or holes into the active layer because of the space charges in the graded layer, which are generated by the piezoelectric effect or spontaneous polarization.

To accomplish the objects, according to a first aspect of the present invention, there is provided a nitride semiconductor stack composed of a nitride compound semiconductor comprising: a nitride semiconductor layer that has a structure in which a bandgap is gradually varied from a substrate side to a surface side, that is doped with at least one of n-type and p-type impurities with a high concentration of at least $1\times10^{18}$ cm$^{-3}$, and has a thickness of 10–100 nm, and that is interposed between an n-type layer at the substrate side and a p-type layer on the surface side.

Here, the bandgap may be gradually decreased, and the nitride semiconductor layer may be doped with the n-type impurities.

The bandgap may be gradually increased, and the nitride semiconductor layer may be doped with the p-type impurities.

According to a second aspect of the present invention, there is provided a semiconductor device consisting of a double heterojunction bipolar transistor that is fabricated using the foregoing nitride semiconductor stack, and includes a collector with a bandgap wider than a bandgap of a base, wherein the semiconductor device is an npn-type heterojunction bipolar transistor in which the base is disposed closer to a surface side of a substrate than the collector, and the nitride semiconductor layer is interposed between the base and the collector.

According to a third aspect of the present invention, there is provided a semiconductor device consisting of a light emitting device that is fabricated using the foregoing nitride semiconductor stack, and that includes from the substrate side to the surface side an n-type layer with a bandgap wider than a bandgap of an active layer, the active layer and a p-type layer with a bandgap wider than the bandgap of the active layer, the semiconductor device comprising: a layer that is interposed between the n-type layer and the active layer or between the active layer and the p-type layer, and has a bandgap gradually varied from the substrate side to the surface side, and that is doped with at least one of n-type and p-type impurities with a high concentration of at least $1\times10^{18}$ cm$^{-3}$, and has a thickness of 10–100 nm.

Here, the layer may be interposed between the n-type layer and the active layer, have a structure in which the bandgap is gradually reduced from the substrate side to the surface side, and be doped with the n-type impurities.

The layer may be interposed between the active layer and the p-type layer, have a structure in which the bandgap is gradually increased from the substrate side to the surface side, and be doped with the p-type impurities.

The layer may be interposed between the n-type layer and the active layer, have a structure in which the bandgap is gradually reduced from the substrate side to the surface side, and be doped with the n-type impurities, and the semiconductor device may further comprise a layer that is interposed between the active layer and the p-type layer, may have a structure in which the bandgap is gradually increased from the substrate side to the surface side, and be doped with the p-type impurities.

With the foregoing structures, the graded layer composed of the nitride semiconductor brings about space charges because of the piezoelectric effect or spontaneous polarization. Since the space charges modulate the band, they form a barrier to electrons or holes moving in a direction perpendicular to the heterointerface. The heavy doping of impurities for canceling out the space charges will prevent the modulation of the band. As a result, the effect is eliminated of the space charges generated by the piezoelectric effect or spontaneous polarization, thereby enabling the electrons or holes to travel smoothly in the direction perpendicular to the heterointerface.

Heterojunction bipolar transistors (HBTs) used as a radio-frequency power amplifier sometimes utilize a double heterostructure in which the bandgap of the collector is wider than the bandgap of the base to obtain a high output. The present invention relates to a structure for achieving high current gain in a double heterojunction bipolar transistor (DHBT) using a nitride semiconductor. It also relates to a structure for achieving high luminous efficiency by reducing the voltage for emission in the light emitting device using the nitride semiconductor.

The most important characteristic of the present invention is to dope the graded layer with impurities of a high concentration equal to or greater than $1\times10^{18}$ cm$^{-3}$ in order to cancel out the space charges generated in the graded layer using the nitride semiconductor. The present invention differs from the conventional techniques in that the graded layer is doped with impurities of the type different from the type of the space charges generated in the graded layer in the nitride semiconductor, and that the impurity concentration is at least $1\times10^{18}$ cm$^{-3}$.

According to the present invention, high concentration impurities are doped to cancel out the effect of the space charges which are considered to be generated in the graded layer composed of the nitride semiconductor because of the piezoelectric effect or spontaneous polarization effect. As a result, in the npn-type DHBT having the graded layer interposed between the base and collector, the electrons injected from the emitter can pass through the base and reach the collector. Thus, the DHBT has an advantage of being able to increase the collector current, thereby achieving high current gain. As for the light emitting device in accordance with the present invention, the electrons or holes can be injected into the active layer efficiently. As a result, the voltage required for the emission can be reduced, and increase the luminous efficiency.

The above and other objects, effects, features and advantages of the present invention will become more apparent from the following description of the embodiments thereof taken in conjunction with the accompanying drawings.

DETAILED DESCRIPTION OF PREFERRED EMBODIMENTS

The preferred embodiments in accordance with the present invention will now be described with reference to the accompanying drawings.

Figure 4:
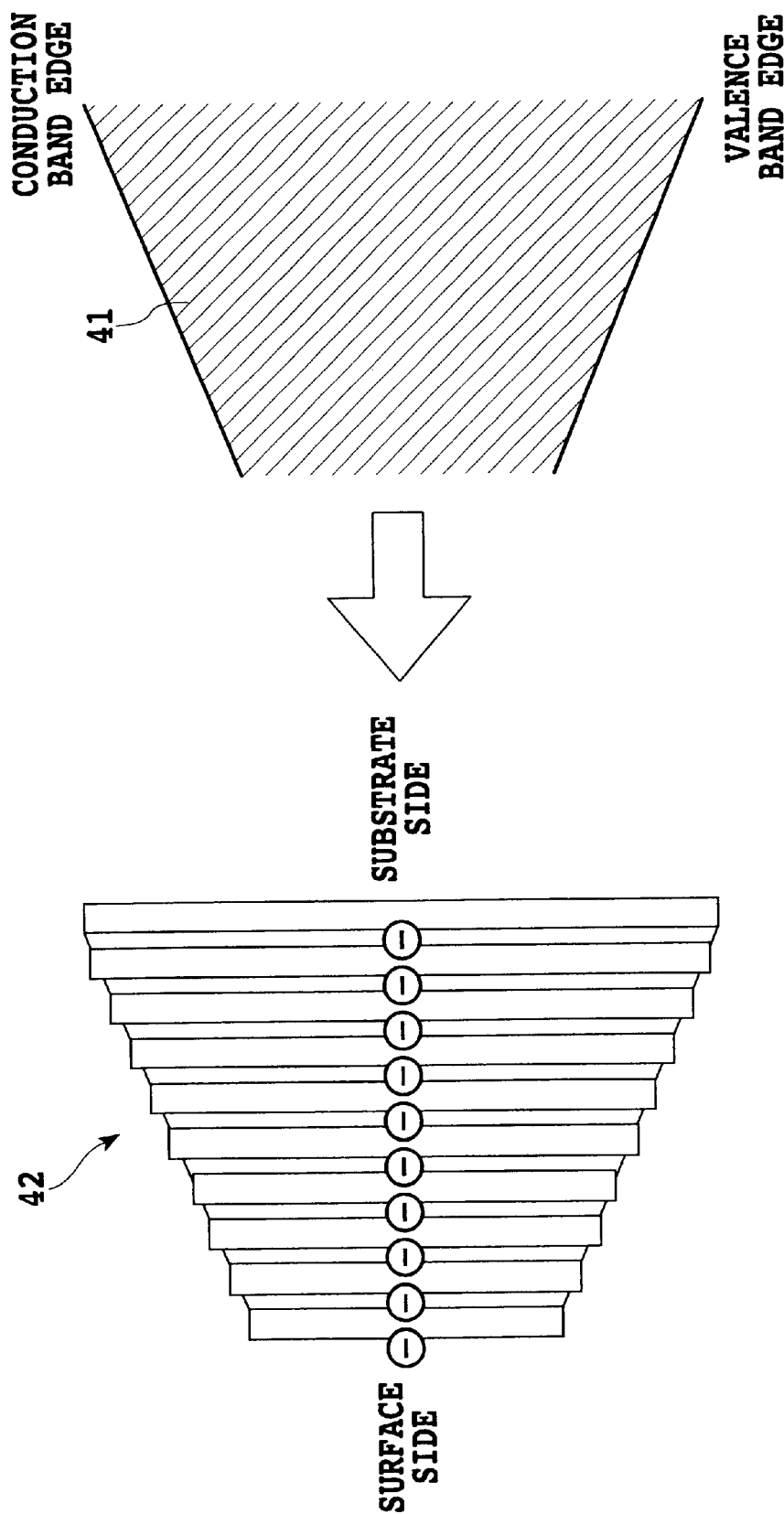
FIG. 4 is a schematic diagram illustrating the mechanism of generating space charges in the graded layer.

FIG. 4 is a schematic diagram illustrating the mechanism of generating space charges in a graded layer. In FIG. 4, the reference numeral 41 designates a graded layer; and 42 designates a graded layer composed of many thin layers whose compositions are varied stepwise. The mechanism of generating charges in the graded layer is considered as follows. First, the graded layer is divided into thin layers. In the structure as shown in FIG. 4, in which the bandgap energy reduces from the substrate side to the surface side, negative space charges are generated on substrate side of individual layers. The amount of the charges depends on the lattice constant difference between the two layers. Considering that the graded layer consists of many heterojunctions, the space charges are present uniformly.

For example, consider a heterointerface at which the sheet concentration of the space charges is $1\times10^{13}$ (cm$^{-2}$). When a 20 (nm) thick graded layer with its lattice constant varying constantly is inserted into the heterojunction, the space charges with the following magnitude are generated uniformly in the graded layer.

$$1\times10^{13}\ (cm^{-2}) \div 20\ (nm) = 5\times10^{18}\ (cm^{-3})$$

Thus, the graded layer includes the high concentration space charges on the order of $10^{18}$ (cm$^{-3}$).

Figure 5:
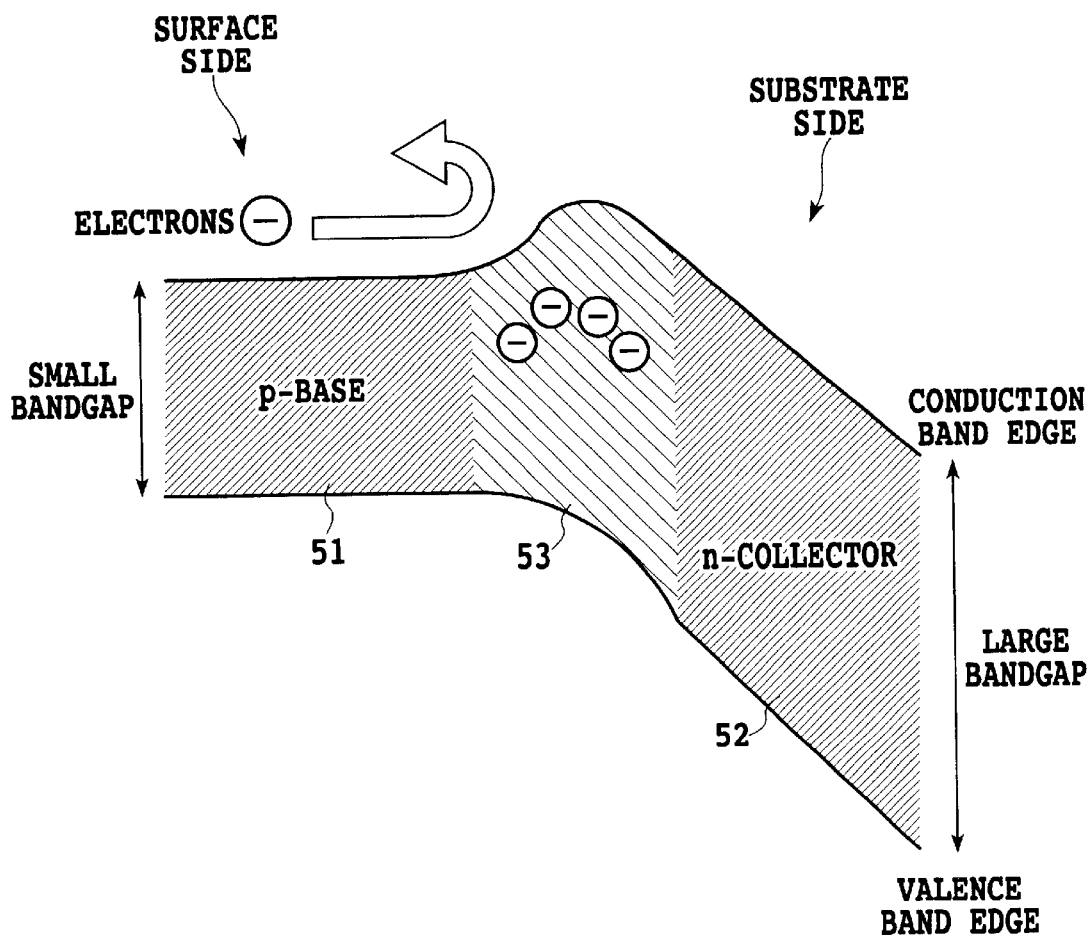
FIG. 5 is a band diagram of a structure in which a graded layer is interposed between the base and collector of an npn-type DHBT without applying the present invention.

FIG. 5 is a band diagram of a structure in which a graded layer is interposed between the base and collector of an npn-type DHBT. In FIG. 5, the reference numeral 51 designates a p-type base, 52 designates an n-type collector and 53 designates a graded layer. When the graded layer is interposed between the base and collector of the npn-type DHBT using a nitride semiconductor, the space charges generated in the graded layer 53 modulate the band, thereby bringing about an elevation that hinders the movement of the electrons.

Figure 1:
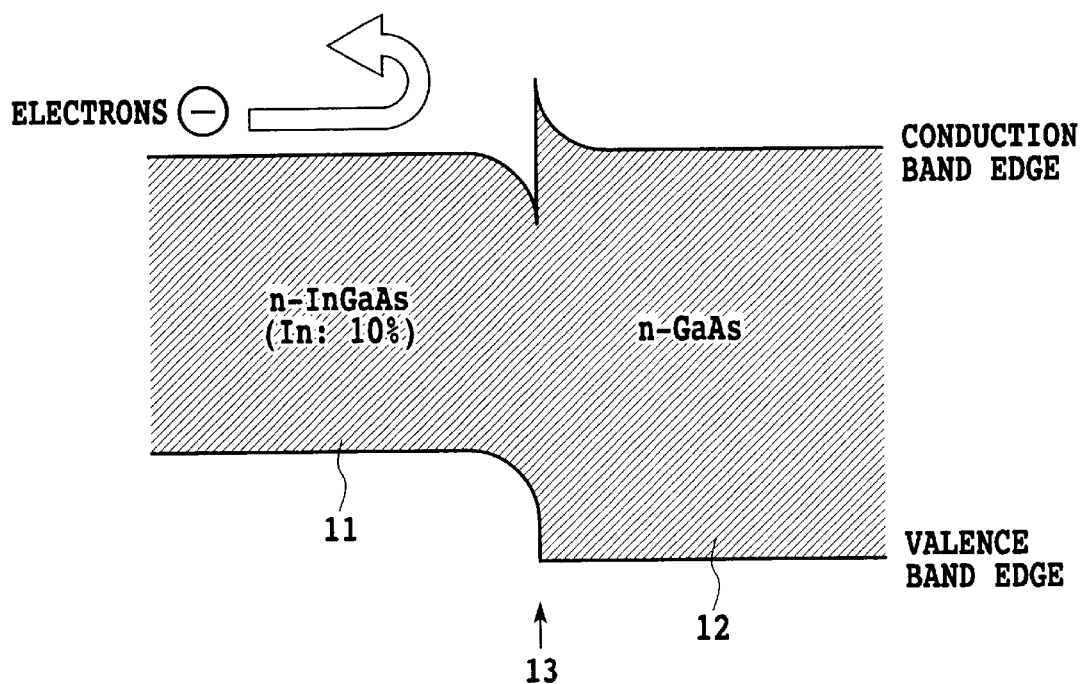
FIG. 1 is a band diagram at a conventional heterojunction of an n-type GaAs and an n-type InGaAs.
Figure 2:
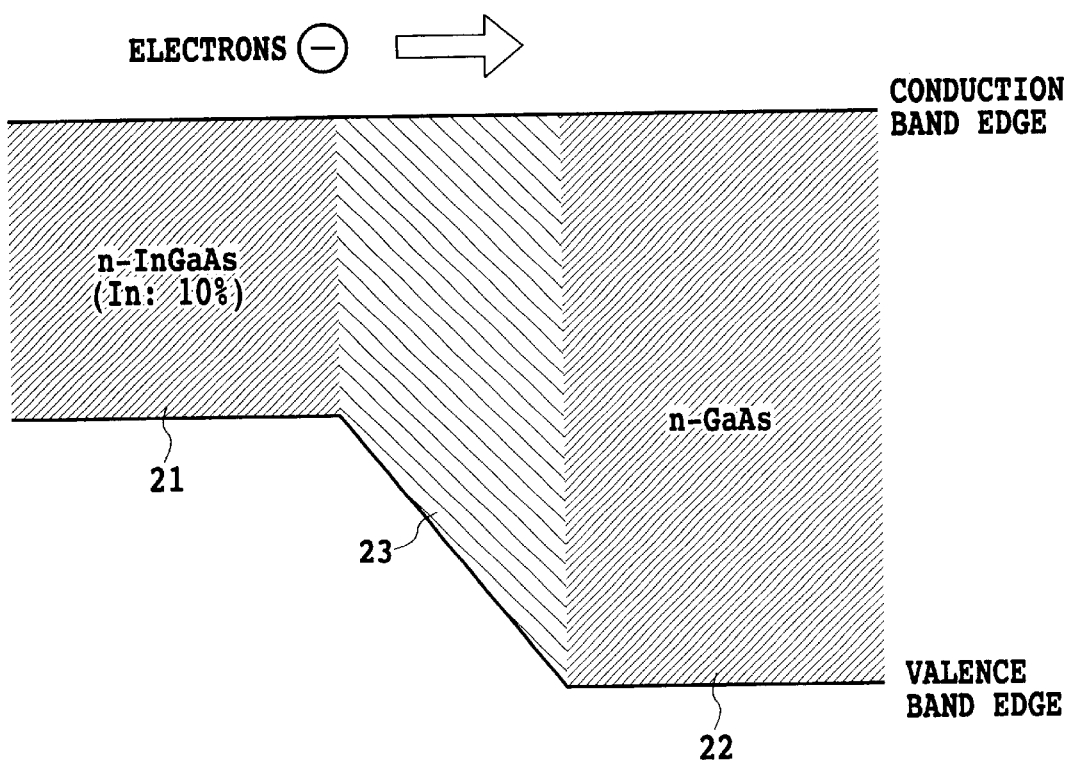
FIG. 2 is a band diagram of a conventional structure in which a graded layer is interposed between an n-type InGaAs with a 10% In composition and an n-type GaAs.
Figure 3:
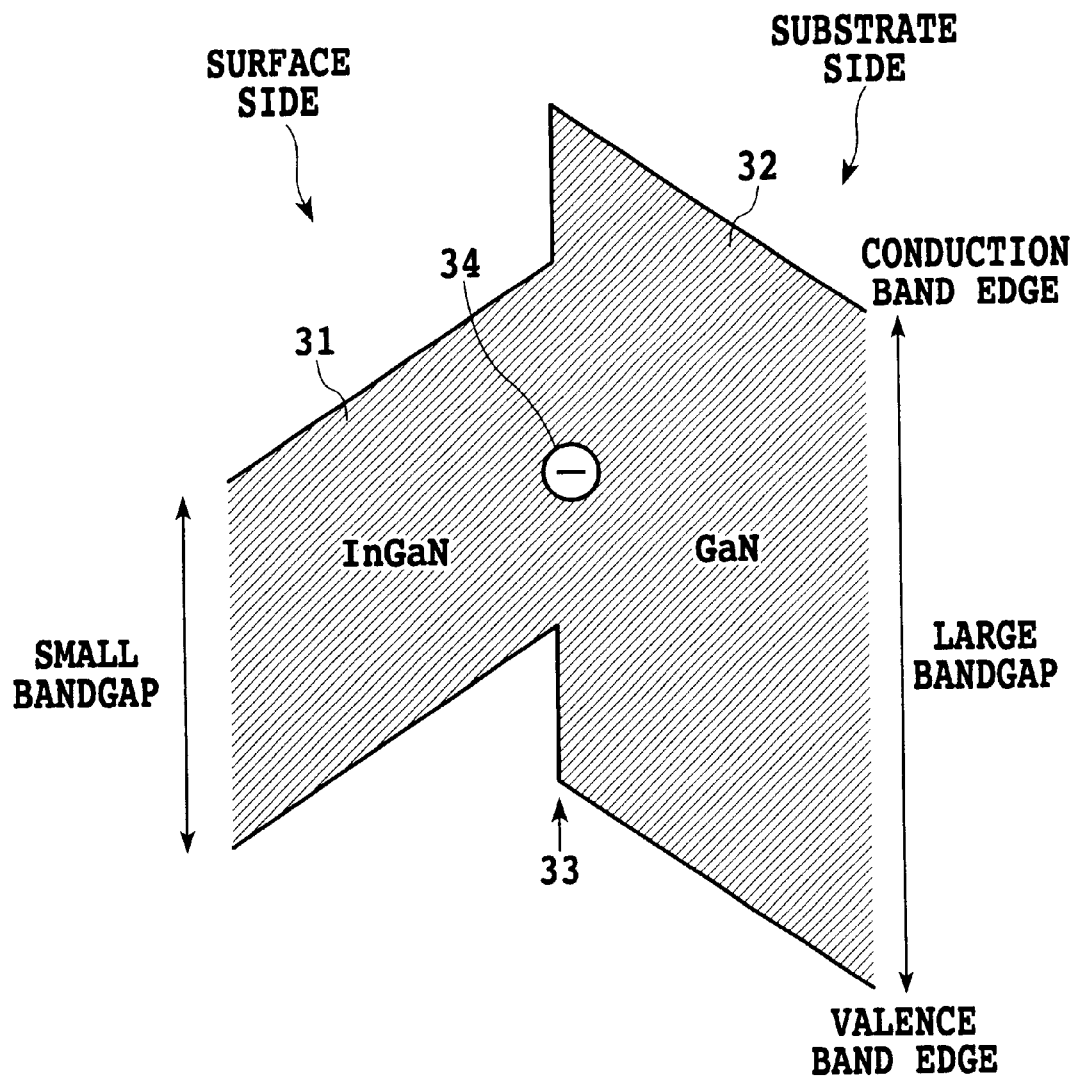
FIG. 3 is a band diagram of a heterojunction of GaN and InGaN in a conventional nitride semiconductor.

Consider a case where GaN is grown on a sapphire substrate using metalorganic vapor phase epitaxy (MOVPE method), followed by growing InGaN thereon. Although the GaN and InGaN include no residual impurities, the space charges are generated at the heterointerface between the GaN and InGaN because of the piezoelectric effect or spontaneous polarization, thereby bringing about the band modulation as shown in FIG. 3.

In addition, when the InGaN graded layer 53 with its In composition being varied is interposed between the GaN 52 and InGaN 51 to eliminate the adverse effect of the band discontinuity on the carrier movement, the space charges are generated in the InGaN graded layer 53 as shown in FIG. 5. The space charges cause band modulation, which operates as a barrier to electrons, and hinders the electrons from reaching the collector side. As a result, it is difficult for the collector current to flow through the DHBT, and hence to increase the current gain.

The foregoing description is made to explain the mechanism in which the space charges in the graded layer using the nitride semiconductor deteriorate the characteristics of the electron device. The space charges present a problem in the light emitting devices as well. The light emitting devices fabricated using the nitride semiconductor are usually composed of an n-type layer with a large bandgap, an active layer with a small bandgap, and a p-type layer with a large bandgap from the substrate side to the surface side. In such structures, a graded layer can be interposed between the n-type layer with the large bandgap and the active layer with the small bandgap, or between the active layer with the small bandgap and the p-type layer with the large bandgap.

Figure 6:
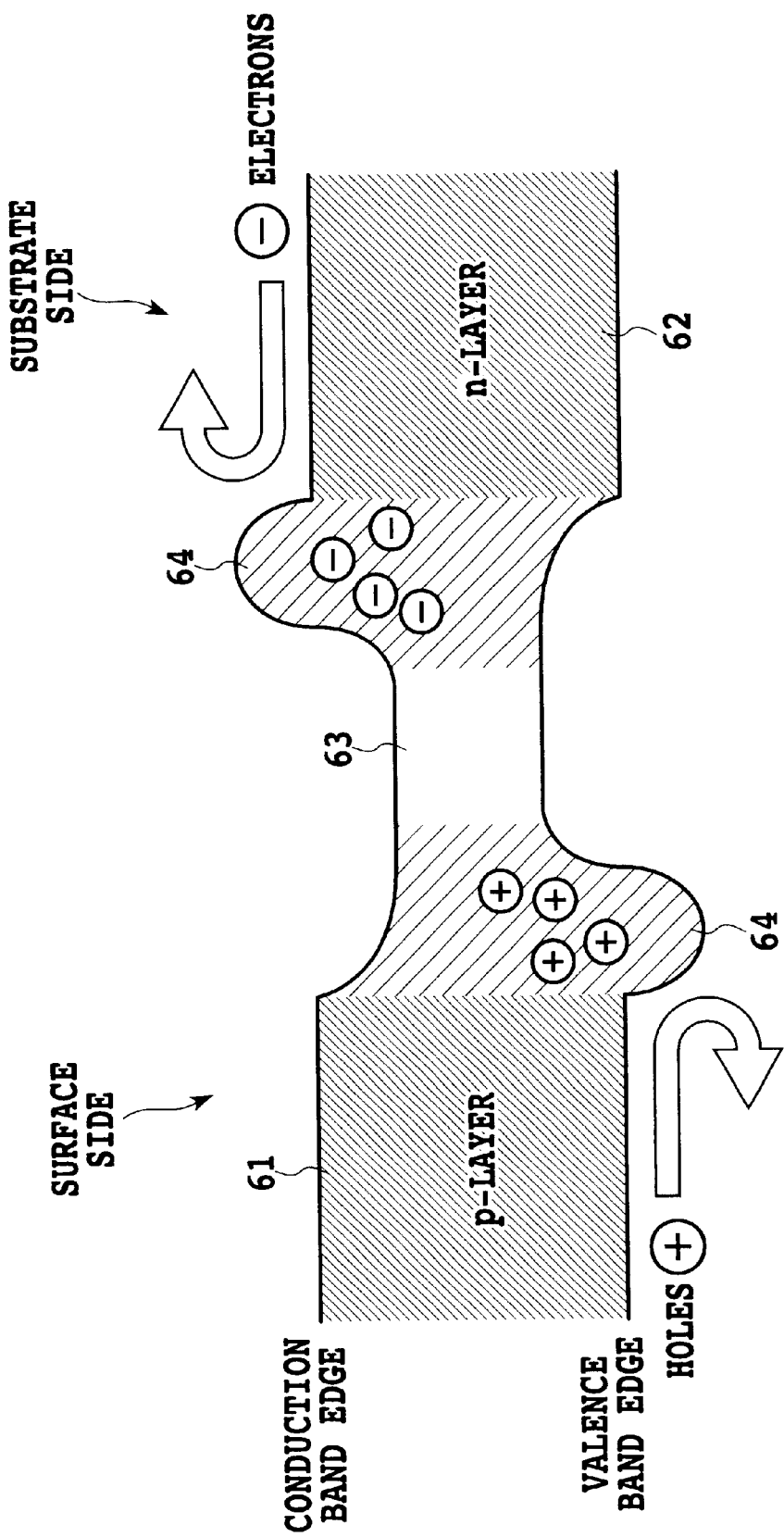
FIG. 6 is a band diagram of a structure in which a graded layer is inserted into a light emitting device without applying the present invention.

FIG. 6 is a band diagram showing the graded layers inserted into the light emitting device. In FIG. 6, the reference numeral 61 designates a p-type layer, 62 designates an n-type layer, 63 designates an active layer and each 64 designates a graded layer. As described before, the graded layers 64 become as shown in FIG. 6 because of the space charges generated therein. Here, the band modulation caused by the impurities contained in the p-type layer 61 or n-type layer 62 is neglected. As is seen from FIG. 6, a barrier against electrons is formed on the n-type layer 62 side, and a barrier against holes is formed on the p-type layer 61 side. Because of the barriers, it becomes difficult to inject the electrons or holes into the active layer 63. As a result, the voltage required for the emission is increased, thereby reducing the luminous efficiency.

EXAMPLE 1

A heterojunction diode composed of a p-type InGaN and n-type GaN was fabricated by growing an epitaxial structure on an SiC substrate by MOVPE method, followed by processing using an electron cyclotron resonance (ECR) etching process. In addition, electrodes were formed by electron beam evaporation. Then, I–V characteristics were measured at room temperature.

Figure 7:
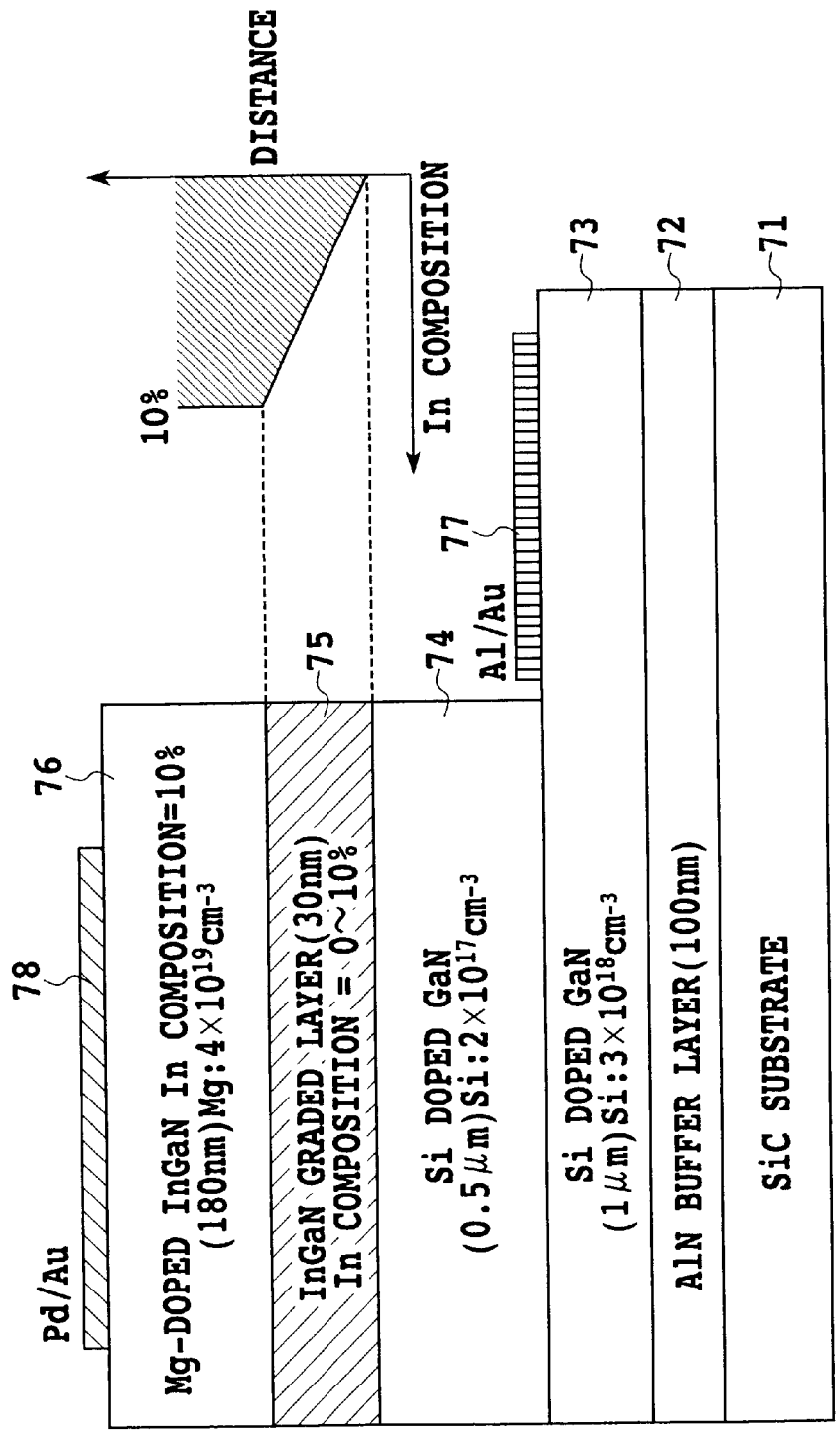
FIG. 7 is a cross-sectional view showing a heterojunction diode structure composed of p-type InGaN and n-type GaN.

FIG. 7 is a cross-sectional view showing a heterojunction diode structure of the p-type InGaN and n-type GaN. In FIG. 7, the reference numeral 71 designates an SiC substrate, 72 designates an AlN buffer layer (100 nm), 73 designates a Si-doped GaN layer (1 μm), 74 designates a Si-doped GaN layer (0.5 μm), 75 designates an InGaN graded layer (30 nm), 76 designates an Mg-doped InGaN layer (180 nm), 77 designates an Al/Au electrode and 78 designates a Pd/Au electrode.

The In composition of the p-type InGaN layer 76 is 10%, and the InGaN graded layer 75, which is interposed between the p-type InGaN layer 76 and n-type GaN layer 74, includes the In composition varied from 0% to 10%. The graded layer 75 is 30 nm thick. The bandgap of the thin film structure gradually reduces from the substrate side to the surface side.

First, at 1100° C., the AlN buffer layer 72 was grown on the SiC substrate 71 by 100 nm, followed by growing the Si-doped GaN layer 73 used for forming an ohmic electrode. The layer 73 has the Si impurity concentration of $3\times10^{18}$ cm$^{-3}$ and the thickness of 1 μm. Subsequently, the Si-doped GaN layer (n-type GaN layer) 74 with the Si impurity concentration of $2\times10^{17}$ cm$^{-3}$ was grown thereon. The layer 74 is 500 nm thick. After that, the InGaN layer 75 was grown with varying the In composition. The layer InGaN 75 is 30 nm thick. The I–V characteristics were compared with varying the Si impurity concentration of the InGaN graded layer 75.

In this case, two types of Si impurity concentrations, $4\times10^{17}$ cm$^{-3}$ and $5\times10^{18}$ cm$^{-3}$, were prepared. The Si impurities serve as n-type impurities in the nitride semiconductor. Subsequently, the Mg-doped InGaN (p-type InGaN layer) 76 with the Mg impurity concentration of $4\times10^{19}$ cm$^{-3}$ was grown. The Mg impurities serve as p-type impurities in the nitride semiconductor. The layer 76 is 180 nm thick, and its In composition is 10%. After growing in the MOVPE method, 10 minute annealing was carried out in a nitrogen atmosphere to activate Mg atoms. The annealing temperature was 700° C. Then, using common photolithography and ECR etching method, the epitaxial structure grown by the MOVPE method was processed to fabricate the heterojunction diode as shown in FIG. 7.

Figure 8:
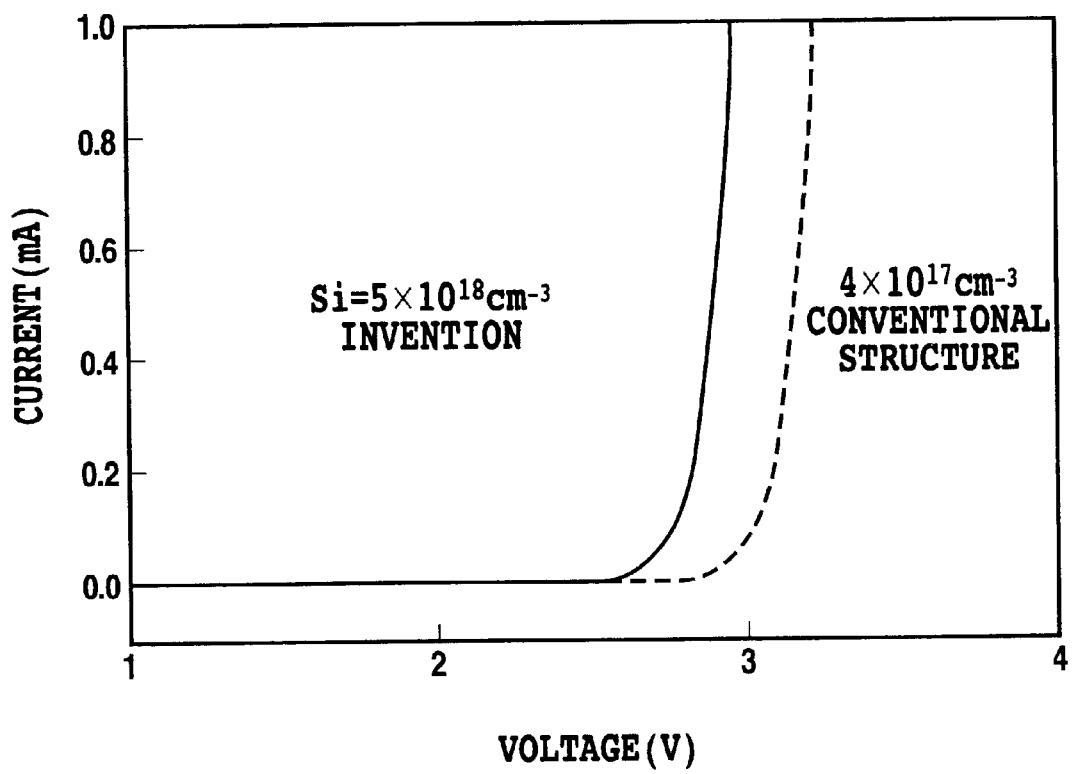
FIG. 8 is a graph illustrating current-voltage (I–V) characteristics of the heterojunction diode measured at room temperature.

FIG. 8 is a graph illustrating I–V characteristics of the heterojunction diode measured at room temperature. The dimensions of the Pd/Au electrode 78 on the p-type layer 76 is 300 μm×300 μm. The turn-on voltage in the conventional case where the Si impurity concentration of the InGaN graded layer 75 is $4\times10^{17}$ cm$^{-3}$ is higher than the turn-on voltage in the present invention case where it is $5\times10^{18}$ cm$^{-3}$. When the Si impurity concentration is low, the barrier caused by the space charges in the graded layer 75 hinders the transit of the electrons, that is, the flow of the current. In contrast with this, a higher Si impurity concentration can eliminate the effect of the space charges, facilitating the flow of the electrons. Thus, the current starts to flow even at a lower voltage.

Figure 9:
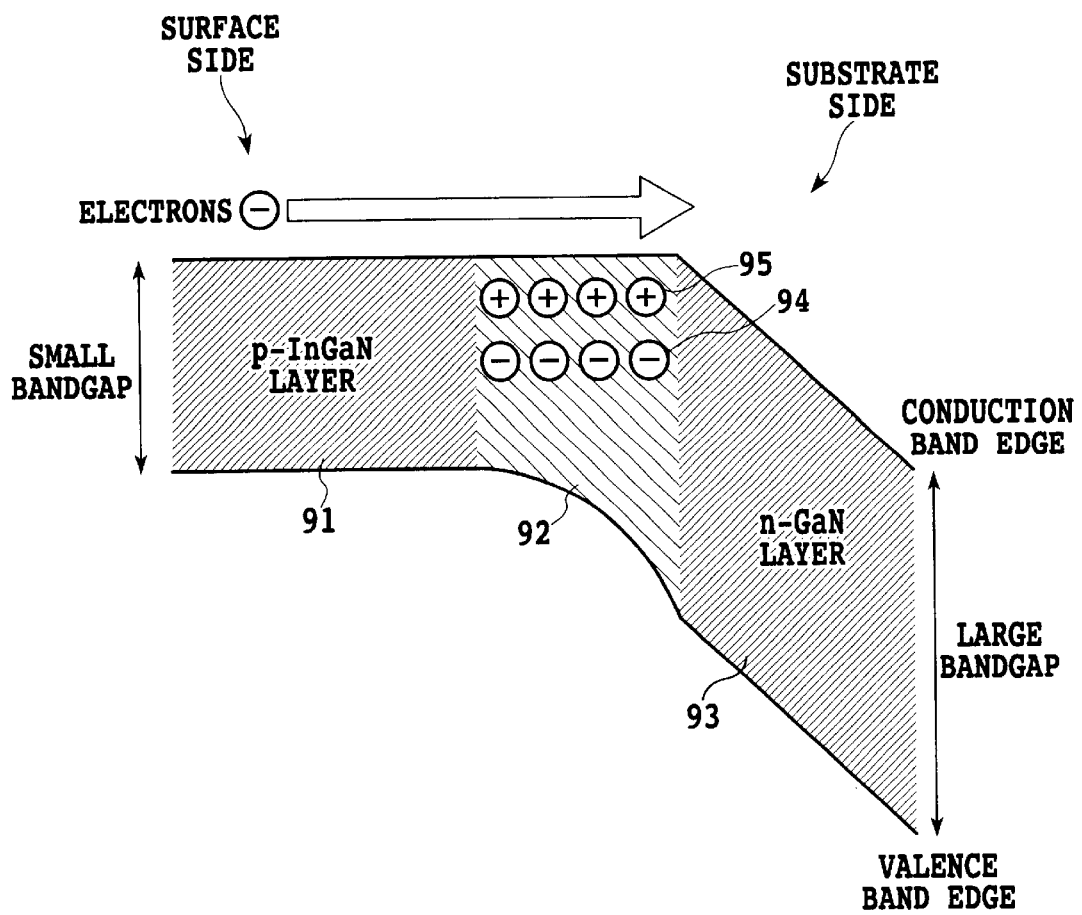
FIG. 9 is a band diagram of the semiconductor structure fabricated in accordance with the present invention.

FIG. 9 is a band diagram of a semiconductor structure fabricated in accordance with the present invention. In FIG. 9, the reference numeral 91 designates a p-type InGaN layer, 92 designates a graded layer (InGaN layer), 93 designates an n-type GaN layer, 94 designates space charges generated by piezoelectric effect or spontaneous polarization effect, and 95 designates n-type impurities for canceling out the space charges.

The piezoelectric effect or spontaneous polarization brings about the space charges 94 in the graded layer 92 made of the nitride semiconductor. Since the space charges 94 modulate the band, they form a barrier to electrons or holes moving in the direction perpendicular to the hetero-interface. The heavy doping of the impurities 95 for canceling out the space charges 94, however, can prevent the band modulation. As a result, the effect of the space charges 94 caused by the piezoelectric effect or spontaneous polarization is eliminated, thereby enabling the electrons or holes to transit in the direction perpendicular to the heterointerface.

EXAMPLE 2

Next, an example of the DHBT composed of the nitride semiconductor in accordance with the present invention will be described.

Figure 10:
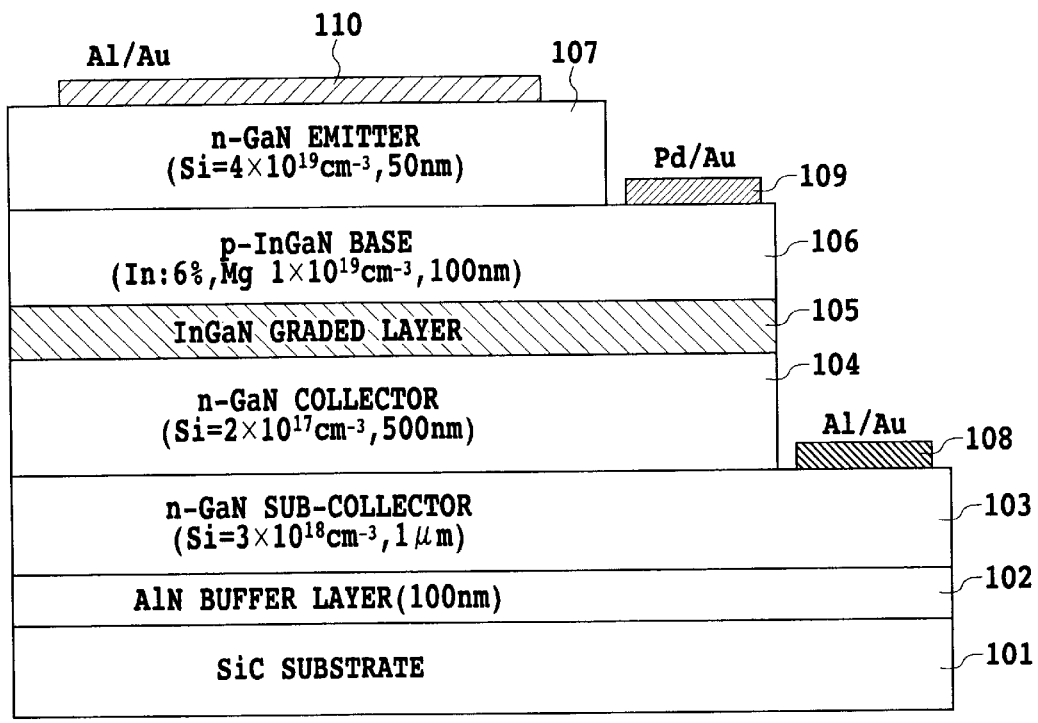
FIG. 10 is a cross-sectional view showing a structure of a DHBT in accordance with the present invention.

FIG. 10 is a cross-sectional view showing a structure of the DHBT in accordance with the present invention. In FIG. 10, the reference numeral 101 designates an SiC substrate, 102 designates an AlN buffer layer (100 nm), 103 designates an n-GaN sub-collector (1 μm), 104 designates an n-GaN collector (500 nm), 105 designates an InGaN graded layer, 106 designates a p-InGaN base (100 nm), 107 designates an n-GaN emitter, 108 designates an Al/Au electrode, 109 designates a Pd/Au electrode and 110 designates an Al/Au electrode.

As in the example 1, an epitaxial structure was grown on the SiC substrate 101 by the MOVPE method, followed by processing by the ECR etching method, and by forming the electrodes by the electron beam evaporation. The InGaN used for the base 106 contained 6% In composition. The In composition of the InGaN layer 105 interposed between the base 106 and collector 104 was varied from 6% to 0% from the base 106 to the collector 104. The common-emitter I–V characteristics were measured with fixing the thickness of the graded InGaN layer 105 at 30 nm, and varying the Si impurity concentration of the graded InGaN layer 105 from $4\times10^{17}$ cm$^{-3}$ to $5\times10^{18}$ cm$^{-3}$. The conditions of the other layers were fixed.

Figure 11:
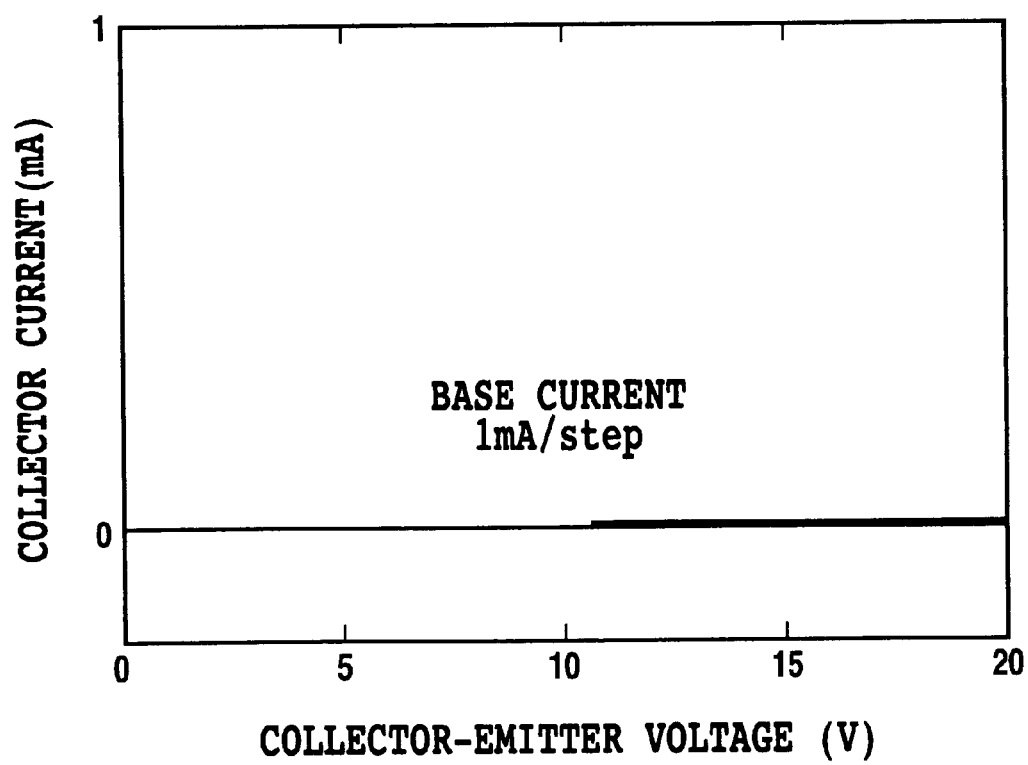
FIG. 11 is a graph illustrating common-emitter I–V characteristics obtained by the Si impurity concentration of $4\times10^{17}$ cm$^{-3}$ in a graded InGaN layer.
Figure 12:
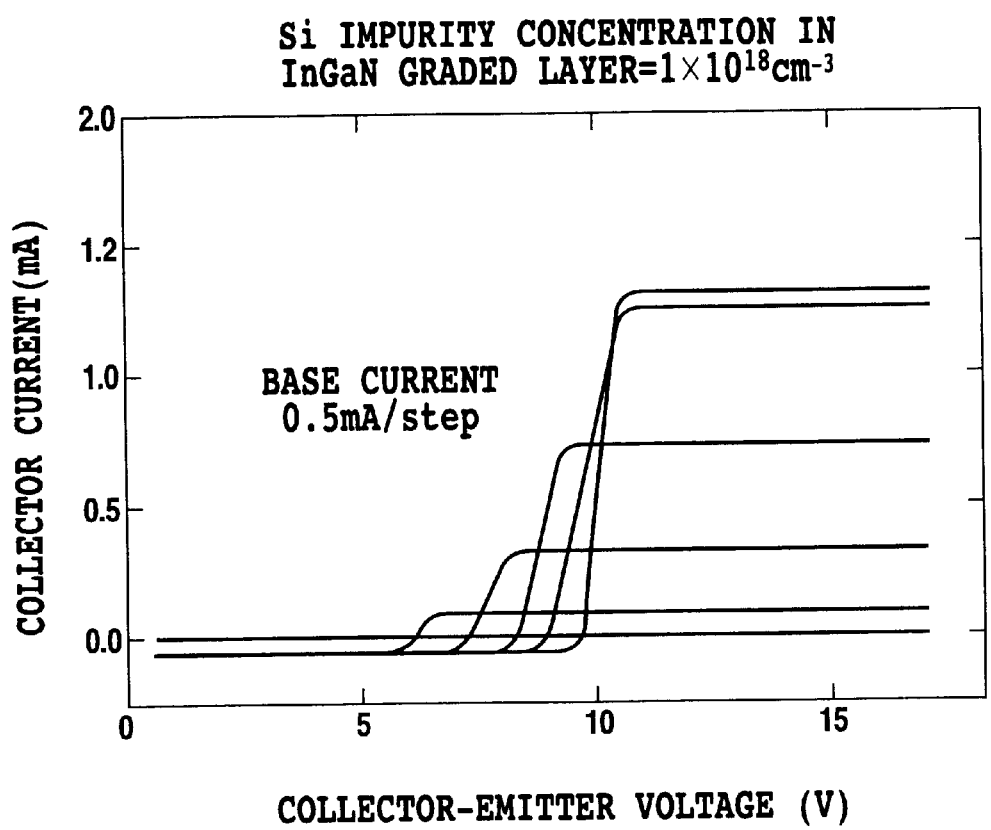
FIG. 12 is a graph illustrating common-emitter I–V characteristics obtained by the Si impurity concentration of $4\times10^{17}$ cm$^{-3}$ in a graded InGaN layer.
Figure 13:
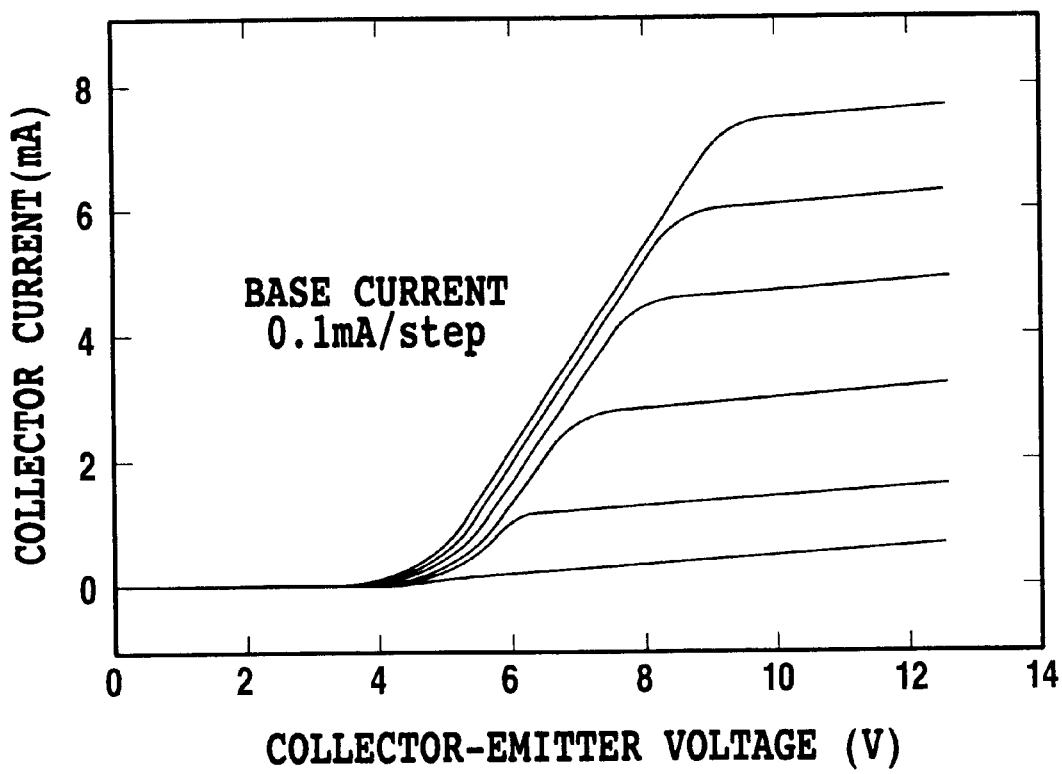
FIG. 13 is a graph illustrating common-emitter I–V characteristics obtained by the Si impurity concentration of $4\times10^{17}$ cm$^{-3}$ in a graded InGaN layer.

FIGS. 11–13 are graphs illustrating the common-emitter I–V characteristics obtained by varying the Si impurity concentration in the graded InGaN layer 105. When the Si impurity concentration in the InGaN graded layer 105 is $4\times10^{17}$ cm$^{-3}$ (FIG. 11), no transistor characteristic is obtained. In contrast, when the Si impurity concentration in the InGaN graded layer 105 is $1\times10^{18}$ cm$^{-3}$ (FIG. 12), the current gain of about unity is obtained at the maximum. When the Si impurity concentration is increased to $5\times10^{18}$ cm$^{-3}$ (FIG. 13), the current gain reaches about 20 at the maximum. Thus, increasing only the Si impurity concentration in the InGaN graded layer 105 causes the current gain to increase. This means that the Si impurities cancels out the space charges in the graded layer 105, and hence the electrons injected from the emitter 107 reach the collector 104 without hindrance of the space charges of the graded layer 105.

In the present example, the p-type InGaN layer is used as the base 106, the n-type GaN layer is used as the collector 104, and the InGaN graded layer 105 is interposed between them. However, this is not essential. For example, the present invention is applicable to a structure that uses a p-type GaN layer as the base 106, and an n-type AlGaN layer as the collector 104, and interposes an AlGaN graded layer 105 between them, offering similar advantages.

Next, the thickness of the graded layer will be described.

The DHBTs conventionally reported are not composed of the nitride semiconductor. Therefore, they do not take account of the piezoelectric effect (including the spontaneous polarization effect) for the graded layer interposed between the base and the collector. In contrast, the present invention, which relates to the nitride semiconductor, must consider the piezoelectric effect.

As for HBTs, the bandgap of a material constituting the emitter is made wider than that of a material constituting the base. In such HBTs, the current gain (β) can be made larger than that of ordinary bipolar transistors (BJTs) without using the heterojunction. The relationships between the bandgap energy difference (ΔE) and β of the two layers is expressed as follows.

$$\beta \sim \exp(q\Delta E/kT)$$

(where~ denotes proportion)

Accordingly, to increase the value β, the bandgap energy difference between the materials used as the emitter and base must be large enough. According to experiment, it is reported that a preferred value of the bandgap energy difference is 200 meV or more (M. Konagai and K. Takahashi, J. Appl. Phys. 46 (1975) 2120).

As for the DHBTS, the emitter and collector are composed of the same material almost all cases. The reasons for this are as follows.

(1) Using the same materials for the emitter and collector can reduce the growth conditions by that amount, thereby being able to simplify the growth as compared with the case where different materials are used for the emitter and collector (facilitating the growing).

(2) Concerning the processes such as etching, the same material will simplify them.

In view of these factors, as for the DHBTs, the bandgap energy difference between the base and the collector is 200 meV or more as that between the emitter and the base. In addition, the current gain, which is a function of the mobility of carriers, decreases when the mobility is reduced. The mobility of the nitride semiconductor is smaller than that of GaAs or InP compound semiconductors by about an order of magnitude. Therefore, a large bandgap energy difference is required to establish a sufficient current gain for the nitride semiconductor DHBTs. Specifically, a 200 meV or more bandgap energy difference is needed for the nitride semiconductor DHBTs.

The bandgap energy difference of 200 meV corresponds to at least 6% In composition in the InGaN/GaN devices. As for the AlGaN/GaN devices, it corresponds to at least 9% Al composition. When the In composition is 6%, the piezoelectric charges generated at the interface between the InGaN and GaN are $6 \times 10^{12}$ (cm$^{-2}$) (O. Ambacher et. al. Journal of Applied Physics, 85, 3222 (1999), and O. Ambacher et. al. Journal of Applied Physics, 87, 334 (2000)). Likewise, when the Al composition is 9%, the piezoelectric charges generated at the interface between the AlGaN and GaN are also $6 \times 10^{12}$ (cm$^{-2}$). Accordingly, assuming that the 30 nm thick graded layer is used as in the conventional DHBT, and that the composition of the graded layer varies uniformly, the electric charges of $$6 \times 10^{12} \ (cm^{-2}) \div 30 \ (nm) = 2 \times 10^{18} \ (cm^{-3})$$

are present uniformly in the graded layer.

A thin graded layer presents the following problems: (1) The composition control is difficult; (2) Since the spread of the wave function of the electrons is on the order of 10 nm, the electrons do not feel the graded layer. Therefore, it is preferable that the thickness of the graded layer be at least 10 nm.

On the contrary, a thick graded layer requires the carriers to take a long transit time to pass through the graded layer. Considering this, a thinner graded layer is preferable. The thinner graded layer, however, requires a higher impurity concentration to cancel out the piezoelectric charges. In this case, although the graded layer is nearly electrically neutral as a whole, the crystal quality is degraded because of the heavy doping of the impurities. In the growth by the ordinary MOVPE method, doping of $3 \times 10^{19}$ (cm$^{-3}$) or more Si impurities into the GaN will degrade the surface morphology. Considering this, it is preferable to avoid doping larger than $10^{19}$ (cm$^{-3}$) concentration into the graded layer.

To achieve the large current gain in the InGaN/GaN DHBTs, it is necessary to increase the In composition and the bandgap energy difference. To maximize the InGaN/GaN bandgap, the heterojunction between the InN and GaN may be used. In this case, the amount of the electric charges in the heterointerface reach no less than $1 \times 10^{14}$ (cm$^2$). It is preferable that the impurities doping concentration for canceling out the charges be less than $1 \times 10^{19}$ (cm$^{-3}$). In this case, the thickness of the graded layer is as follows:

$$1 \times 10^{14} \ (cm^{-2}) \div 1 \times 10^{19} \ (cm^{-3}) = 100 \ (nm)$$

Therefore, maximum value of the thickness of the graded layer is 100 (nm).

Thus, it is preferable that the thickness of the graded layer be equal to or greater than 10 (nm) and equal to or less than 100 (nm).

It is possible theoretically to form the heterojunction between the InN and GaN. However, it is difficult to grow a flat InN layer on the GaN because of the large lattice constant difference between the InN and GaN constituting the heterojunction. To obtain a flat InGaN layer, we found that the In composition of the InGaN layer should be equal to or less than 50% by examining various conditions. In this case, the amount of electricity at the heterointerface reaches no less than $5 \times 10^{13}$ (cm$^{-2}$). Therefore, considering that the impurity doping concentration to cancel out the electric charges is equal to or less than $1 \times 10^{19}$ (cm$^{-3}$), the thickness of the graded layer is preferably equal to or less than 50 nm.

The piezoelectric charge density Ns can be estimated as follows:

As for the amount of the piezoelectric charges generated in the heterointerface between the InGaN and GaN, O. Ambacher et al. discloses an evaluation method (O. Ambacher, J. Smart, J. R. Shealy, N. G. Weimann, K. Chu, M. Murphy, W. J. Schaff, and L. F. Eastman, J. Appl. Phys. 85, 3222, (1999)).

According to the paper, the piezoelectric charge density Ns (cm$^{-2}$) produced in the heterointerface is given by the following expression:

$$Ns = 2 \times [(a-a_0)/a_0] \times (e_{31} - e_{33} \times c_{13}/c_{33})/q \times 1000 \ (cm^{-2})$$

where for the In composition x in the heterointerface between the InGaN and GaN, a=0.351x+3.189 (Å)

$e_{31}$=−0.08x−0.49

$e_{33}$=0.24x+0.73

$c_{13}$=−11x+103

$c_{33}$=−181x+405 and q=1.6×10$^{-19}$ (C)

$a_0$=3.189 (Å).

From these equations, it is seen that the In composition x is approximately proportional to Ns. Calculation of the Ns of the InN and InGaN with 50% In composition gives the following values.

In the heterointerface between the InN and GaN, substituting x=1 into the foregoing expression gives the following.

$$Ns = 1 \times 10^{14} \ (cm^{-2})$$

In addition, for the InGaN with the 50% In composition, substituting x=0.5 gives the following.

$$Ns = 5 \times 10^{13} \ (cm^{-2})$$

EXAMPLE 3

Next, an example will be described of an LED composed of the nitride semiconductor in accordance with the present invention.

Figure 14:
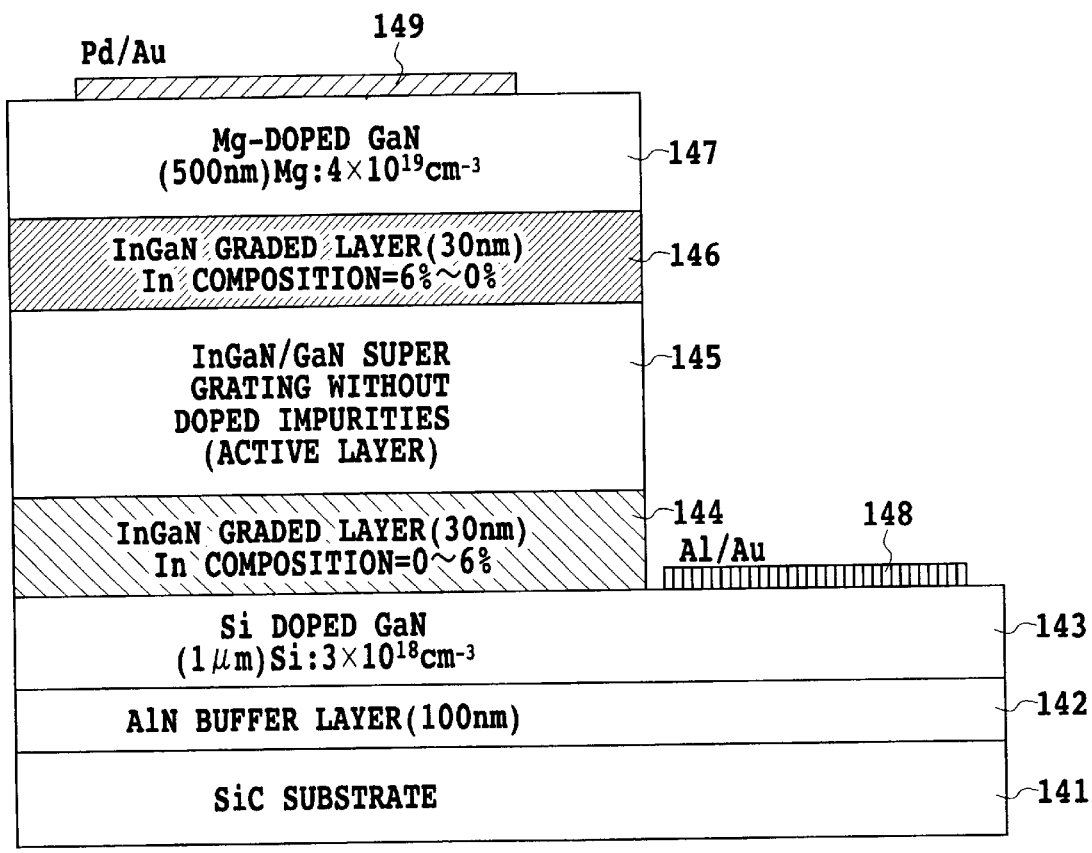
FIG. 14 is a cross-sectional view showing a structure of a light emitting diode (LED) in accordance with the present invention.

FIG. 14 is a cross-sectional view showing a structure of an LED in accordance with the present invention. In FIG.

14, the reference numeral 141 designates an SiC substrate, 142 designates an AlN buffer layer (100 nm), 143 designates a Si-doped GaN layer (1 µm), 144 designates an InGaN graded layer (30 nm), 145 designates an InGaN/GaN super lattice (active layer) without any impurities doped, 146 designates an InGaN graded layer (30 nm), 147 designates an Mg-doped GaN layer (500 nm), 148 designates an Al/Au electrode and 149 designates a Pd/Au electrode.

As in the example 1, an epitaxial structure was grown on the SiC substrate 141 by the MOVPE method, followed by processing using the ECR etching method, and by forming the electrodes by the electron beam evaporation. The active layer 145 consists of the InGaN/GaN super lattices in which the barrier layer includes a 6% In composition, and the well layer includes a 10% In composition. The barrier layer and well layer are 5 nm and 2 nm thick, respectively, and the number of well layers is five. The In composition in the InGaN layer 144 interposed between the n-type impurity layer 143 and active layer 145 increases from 0% to 6% from the n-type impurity layer 143 to the active layer 145. With such a structure, the bandgap gradually reduced from the substrate side to the surface side.

In addition, the In composition in the InGaN layer 146 interposed between the active layer 145 and the p-type impurity layer 147 varies from 6% to 0% from the active layer 145 to the p-type impurity layer 147. With such a structure, the bandgap gradually increases from the substrate side to the surface side.

The thickness of the two InGaN graded layers 144 and 146 is fixed at 30 nm. As for the InGaN graded layer 144 interposed between the n-type impurity layer 143 and the active layer 145, two structures were fabricated; one has no n-type impurities such as Si impurities doped; and the other has $1\times10^{18}$ cm$^{-3}$ Si impurities doped.

As for the InGaN graded layer 146 interposed between the active layer 145 and the p-type impurity layer 147, two structures were fabricated: one has no p-type impurities such as Mg impurities doped, and the other has $1\times10^{18}$ cm$^{-3}$ Mg impurities doped.

Figure 15:
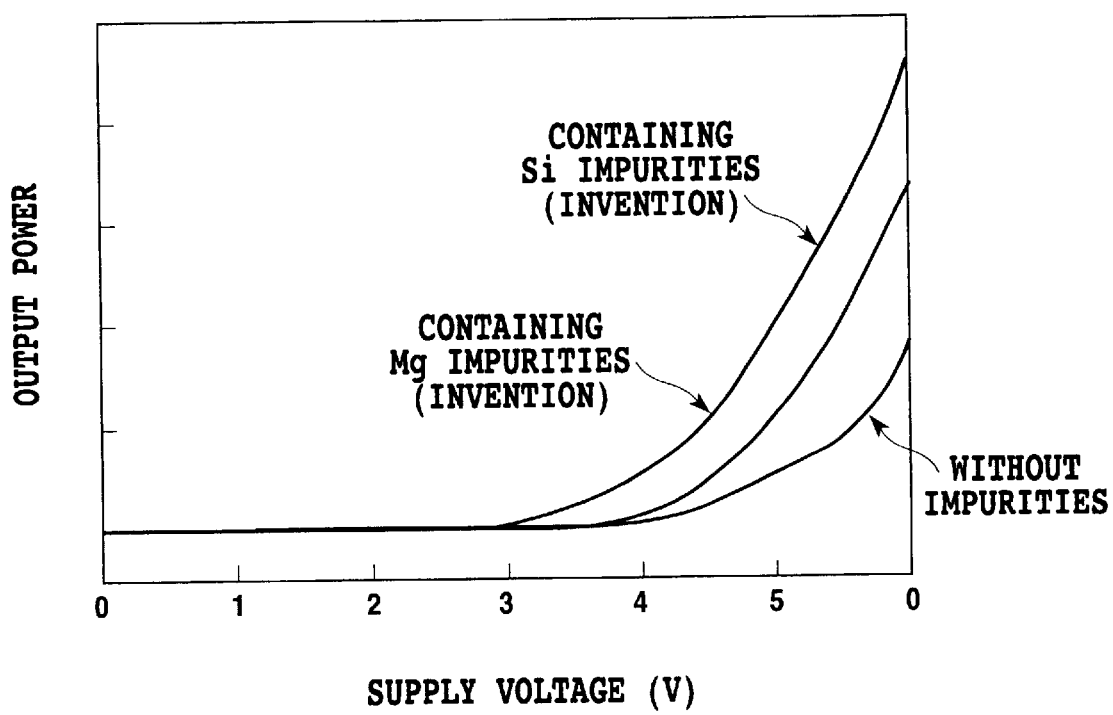
FIG. 15 is a graph illustrating relationship between a supply voltage and the output of a silicon photodiode in the LED in accordance with the present invention.

Supplying the two structures with a voltage enabled the LED to emit light, and the light intensity was measured by a silicon photodiode. FIG. 15 illustrates relationship between the voltage applied to the LED and the output of the silicon photodiode. By doping the InGaN graded layers 144 and 146 with $1\times10^{18}$ cm$^{-3}$ n-type or p-type impurities in accordance with the present invention, an emission output is obtained using a low voltage. In addition, by doping them with both the n-type impurities (Si) and p-type impurities (Mg), even a low voltage equal to or less than 3 V can bring about light emission.

Figure 16:
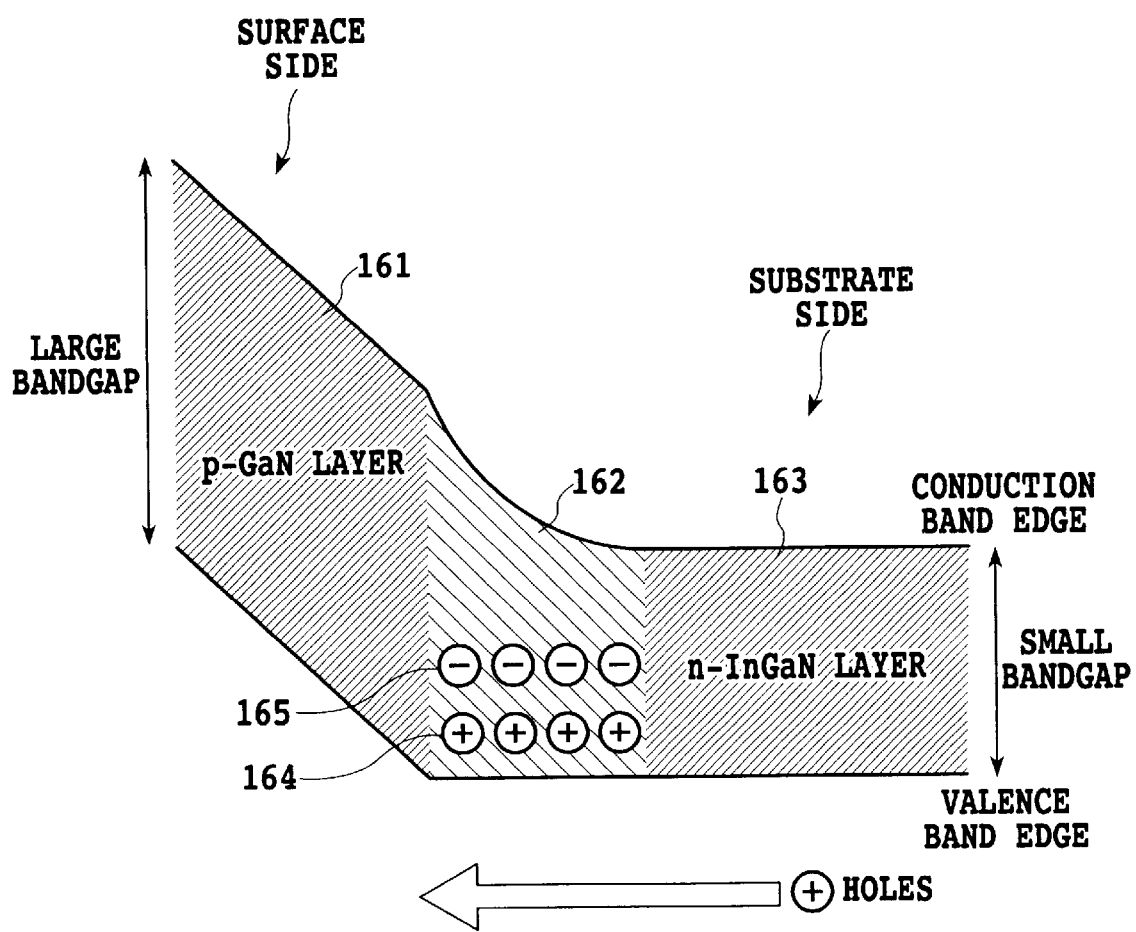
FIG. 16 is diagram showing a diode structure in which the bandgap is gradually increased from a substrate side to a surface side.

FIG. 16 is diagram showing a diode structure in which the bandgap is gradually increased from a substrate side to a surface side. In FIG. 16, the reference numeral 161 designates a p-type GaN layer, 162 designates a graded layer (InGaN layer), 163 designates an n-type InGaN layer, 164 designates p-type impurities for canceling out the space charges, and 165 designates space charges generated by the piezoelectric effect or spontaneous polarization effect.

In the diode structure as shown in the example 1, the bandgap is gradually reduced from the substrate side to the surface side. In contrast with this, the diode structure in which the bandgap is gradually increased from the substrate side to the surface side is also possible. In the graded layer 162 whose bandgap is gradually increased, the In composition is gradually reduced from the substrate side to the surface side. Accordingly, the positive charges 165 are generated in the graded layer 162 with this structure because of the piezoelectric effect or spontaneous polarization effect. To cancel out the positive space charges 165, the graded layer 162 is doped with p-type impurities on the order of $10^{18}$ cm$^{-3}$. The doping of the p-type impurities eliminates the barrier to holes so that the holes can transit from the substrate side to the surface side smoothly. As a result, the turn-on voltage of the diode can be reduced as in the example 1.

The structures of the examples in accordance with the present invention were fabricated by the MOVPE method. The growth of the GaN was performed using trimethylgallium (TMGa), source gas of Ga atoms, and ammonia (NH$_3$), source gas of nitrogen atoms. The growth of the InGaN was performed using trimethylindium (TMIn), source gas of In atoms, triethylgallium (TEGa), source gas of Ga atoms, and ammonia (NH$_3$), source gas of nitrogen atoms. As for the graded layer in which the In composition is varied, the flow ratio of TMIn and TEG was varied to grow the desired graded structure. The grow temperature was 1000° C. or 780° C. As the n-type impurities and p-type impurities, the Si impurities and Mg impurities were used. To dope these impurities, silane (SiH$_4$), source gas of Si atoms, and biscyclopentadienyl magnesium (Cp$_2$Mg), source gas of Mg atoms, are supplied together with other growth gases. The doping concentrations of the impurities were controlled by the flow of the source gases. In addition, a commonly used SiC substrate or sapphire substrate was used as the substrate.

In the examples in accordance with the present invention, the description is made of the heterojunction between the GaN with a large bandgap and the InGaN with a smaller bandgap than that of the GaN. As for the heterojunction of the nitride semiconductor, however, various combinations other than the combination of the GaN and InGaN described in the foregoing example are possible. In the nitride semiconductor, the bandgap becomes smaller in the order of AlN, AlGaN, GaN, InGaN and InN. Thus, combining the nitride semiconductors having a larger bandgap with the nitride semiconductors having a smaller bandgap enables the present invention to be applied to the heterojunctions such as AlGaN and GaN, AlGaN and InGaN, and AlN and InN. In addition, BN and BGaN including B atoms have a greater bandgap than the GaN. It will be easily inferred that the present invention is applicable to the heterojunction of the BN or BGaN with the GaN.

The foregoing description is made by way of example including three elements at most. However, as for AlInGaN including four elements, for example, when the Al composition is high, the bandgap of the AlInGaN is wider than GaN, whereas when the In composition is high, the bandgap of the AlInGaN is narrower than GaN. When the heterojunction of the AlInGaN and GaN is formed, the space charges generated in the graded layer become positive or negative depending on the magnitude of the bandgap. Therefore, application of the present invention demands special care in this case. In addition, applying the present invention to the case including four or more elements also requires special care.

As a structure analogous to the examples in accordance with the present invention is reported concerning a metal/semiconductor/graded layer/semiconductor structure is reported in GaAs compound semiconductors. For example, in a metal/InAs/InGaAs graded layer/GaAs structure, all the InAs layer, InGaAs graded layer and GaAs layer are doped with n-type impurities with high concentrations of equal to or greater than $10^{18}$ cm$^{-3}$ (T. Nittono, H. Ito, O. Nakajima, and T. Ishibashi, Jpn. J. Appl. Phys. 25 (1986) L865).

The structure is proposed to reduce the ohmic resistance between the metal and semiconductor. To reduce the ohmic resistance in this structure, it is necessary for the two semiconductor layers adjacent to the graded layer to be heavily doped with the same impurities as the impurities of the graded layer. In other words, the two semiconductor layers adjacent to the graded layer have the same conductivity type. In contrast with this, although the graded layer is heavily doped with the impurities in the order of $10^{18}$ cm$^{-3}$ in the examples in accordance with the present invention, the two semiconductor layers adjacent to the graded layer have different conductivity types, or at least one of them is not doped. Thus, the present invention relates to a diode structure, and differs from the conventional technique in the structure.

In addition, in npn-type AlGaAs/GaAs HBTs, the p-type base sometimes consists of a graded layer, which is heavily doped with p-type impurities of $10^{18}$ cm$^{-3}$ or more. The base consisting of the graded layer will bring about electric field in it. The internal electric field accesses minority carriers passing through the base, thereby increasing the current gain. Thus, the conventional technique uses the graded layer as the base. In contrast with this, according to the present invention, the graded layer is interposed between the base and the collector.

The present invention has been described in detail with respect of preferred embodiments, and it will now be apparent from foregoing to those skilled in the art that changes and modifications may be made without departing from the invention in its broader aspects, and it is the intention, therefore, in the appended claims to cover all such changes and modifications as fall within true spirit of the invention.

What is claimed is:

1. A nitride semiconductor stack composed of a nitride compound semiconductor - a nitride semiconductor layer that has a structure in which a bandgap is gradually varied from a substrate side to a surface side, that is doped with at least one of n-type and p-type impurities with a high concentration of at least $1\times10^{18}$ cm$^{-3}$, and has a thickness of 10–100 nm, and that is interposed between an n-type layer at the substrate side and a p-type layer on the surface side.

2. The nitride semiconductor stack as claimed in claim 1, wherein said nitride semiconductor layer has a thickness of 10–50 nm.

3. The nitride semiconductor stack as claimed in claim 2, wherein the bandgap is gradually decreased, and said nitride semiconductor layer is doped with the n-type impurities.

4. The nitride semiconductor stack as claimed in claim 2, wherein the bandgap is gradually increased, and said nitride semiconductor layer is doped with the p-type impurities.

5. The nitride semiconductor stack as claimed in claim 1, wherein the bandgap is gradually decreased, and said nitride semiconductor layer is doped with the n-type impurities.

6. The nitride semiconductor stack as claimed in claim 1, wherein the bandgap is gradually increased, and said nitride semiconductor layer is doped with the p-type impurities.

* * * * *